United States Patent [19]

Bohr

[11] 4,372,034

[45] Feb. 8, 1983

[54] PROCESS FOR FORMING CONTACT OPENINGS THROUGH OXIDE LAYERS

[75] Inventor: Mark T. Bohr, Aloha, Oreg.

[73] Assignee: Intel Corporation, Santa Clara, Calif.

[21] Appl. No.: 248,013

[22] Filed: Mar. 26, 1981

[51] Int. Cl.³ .................. H01L 21/265; H01L 21/31
[52] U.S. Cl. ................................ 29/577 C; 29/578
[58] Field of Search ............... 29/578, 579, 577 C; 357/40, 45; 156/628, 643, 653, 659.1; 430/314, 316, 317

[56] References Cited

U.S. PATENT DOCUMENTS

| | | | |
|---|---|---|---|
| 3,497,407 | 2/1970 | Esch et al. | 148/1.5 X |
| 3,635,774 | 1/1972 | Ohta | 156/653 |
| 4,147,564 | 4/1979 | Magee et al. | 156/628 X |
| 4,309,812 | 1/1982 | Horng et al. | 29/579 X |

FOREIGN PATENT DOCUMENTS

| | | | |
|---|---|---|---|
| 55-95339 | 7/1980 | Japan | 156/653 |
| 55-134948 | 10/1980 | Japan | 156/659.1 |

Primary Examiner—L. Dewayne Rutledge
Assistant Examiner—David A. Hey
Attorney, Agent, or Firm—Blakely, Sokoloff, Taylor and Zafman

[57] ABSTRACT

A process is described for forming an opening for a contact member through a deposited oxide layer and thermally grown oxide layer. Where the deposited oxide layer is rich in phosphorus, a wet etchant is used to etch through the deposited oxide layer. This results in a tapered opening through the deposited oxide layer. Then a plasma etchant is used to form an opening through the thermally grown oxide in alignment with an opening through a photoresist layer.

10 Claims, 8 Drawing Figures

PROCESS FOR FORMING CONTACT OPENINGS THROUGH OXIDE LAYERS

BACKGROUND OF THE INVENTION

1. Field of the Invention

The invention relates to the field of integrated circuit fabrication and particularly to the formation of openings for ohmic contacts, and the like, through silicon dioxide layers.

2. Prior Art

During the fabrication of metal-oxide-semiconductor (MOS) integrated circuits, a glass layer (phosphorus doped SiO2) is often formed over an underlying thermally grown oxide (SiO2) layer. In the "rear end" processing of such devices, openings are made through the layers to expose underlying substrate regions. Then contact members such as aluminum contacts are formed in the opening in contact with the exposed substrate regions.

If a wet etchant is used to form the openings for the contacts, the openings become too large for high density circuits. This occurs since the phosphorus glass etches much faster than the thermally grown oxide. During the time that the etchant is attacking the thermally grown oxide, substantially more of the phosphorus glass is etched away, leaving a large opening.

If a plasma etchant is used to etch through both layers, relatively straight edged openings are formed in alignment with the overlying openings in the photoresist layer. The sharp corners of these openings are not particularly suitable for metal contacts since the metal layer coverage over these corners and into the contact openings is thinned, resulting in high current densities in the metal. In some cases in the prior art, a high temperature glass reflow step is used to round-off the sharp edges.

For the most part in the prior art, a compromise between the above-described wet etchant and plasma etchant is used. A dry plasma etchant is used to etch through the phosphorus glass followed by a wet etchant to etch through the thermally grown oxide. During the etching of the thermally grown oxide, the wet etchant enlarges the openings through the phosphorus glass thereby solving the problems associated with the sharp corners. A problem with this process is that the openings through the thermally grown oxide are relatively large, and more importantly, it is difficult to control the size of these openings. This, of course, means the underlying substrate regions (to which contact is being made) must be larger.

As will be seen, the present invention provides a tapered openings through the phosphorus doped glass and a narrow opening through the thermally grown oxide.

In another embodiment where a low phosphorus glass is used, the same result is achieved.

SUMMARY OF THE INVENTION

The invented process is particularly useful in the fabrication of metal-oxide-semiconductor (MOS) integrated circuits where a substrate is covered with a thermally grown oxide layer and where a deposited oxide layer containing phosphorus is formed over the grown oxide. The process enables the formation of tapered openings through the deposited oxide layer and narrow openings through the thermally grown oxide layer. These latter openings typically contact doped regions in the substrate. First a photoresist layer is formed over the deposited oxide layer and a narrow opening (or openings) are formed through the photoresist layer using ordinary photolithographic techniques. Then, a wet etchant is used to etch through the deposited oxide layer at the opening. The resultant opening through this oxide layer is tapered. Since this oxide layer etches quickly when compared to the thermally grown oxide layer, very little of the thermally grown oxide is etched. Now, a plasma etchant is used to etch through the thermally grown oxide layer, such opening being formed in alignment with the opening through the photoresist layer. Thus, a tapered opening results through the deposited oxide layer and a narrow opening through the thermally grown oxide layer.

DETAILED DESCRIPTION OF THE INVENTION

A process is described for forming openings for ohmic contacts through oxide layers, particularly through a chemical vapor deposited silicon dioxide layer which includes phosphorus and an underlying thermally grown silicon dioxide layer. In the following description, numerous specific details such as specific layer thicknesses are set forth in order to provide a thorough understanding of the present invention. It will be obvious to one skilled in the art that these specific details need not be employed to practice the present invention. In other instances, well-known processing steps have not been described in detail in order not to obscure the present invention in unnecessary detail.

Figure 1:
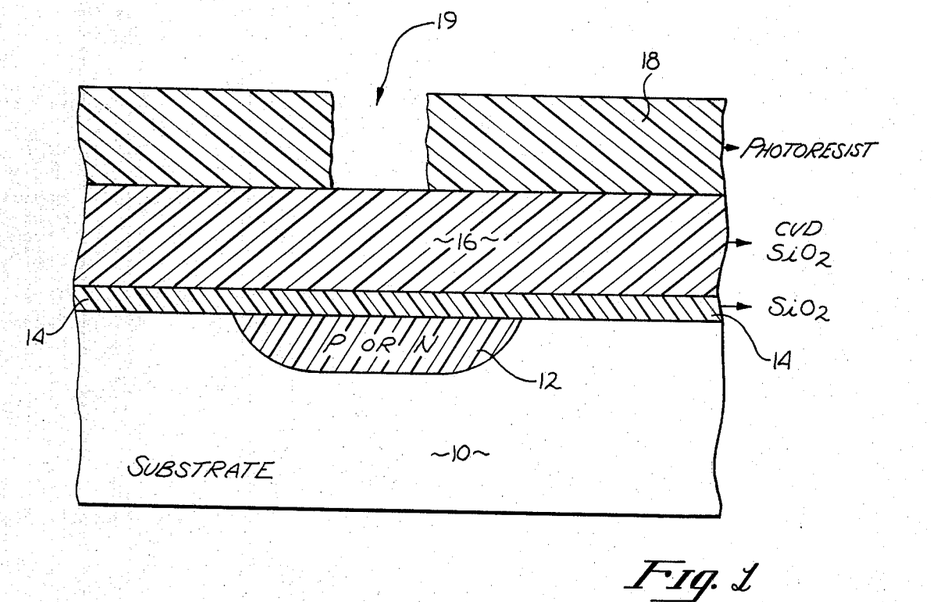
FIG. 1 is cross-sectional elevation view of a substrate which includes a doped region, thermally grown silicon dioxide (oxide) layer, deposited silicon dioxide (oxide) layer and an overlying photoresist layer having an opening formed therethrough.

Referring first to FIG. 1, a portion of a substrate 10 is shown which includes a doped region 12. The specific conductivity type of the substrate 10 or doped region 12 is not critical to the present invention. The present invention, however, is currently employed in the fabrication of CMOS integrated circuits with a process described in copending application Ser. No. 133,580 filed Mar. 24, 1980 and assigned to the assignee of the present application.

A thermally grown oxide layer 14 is formed on the substrate 10; this layer is approximately 1500 A–2000 A thick in the currently employed and preferred process. A chemical vapor deposited, silicon dioxide layer 16 is formed over the layer 14; this layer is approximately 1 micron thick. This layer includes between 8–10% of phosphorus and is sometimes referred to as a glass layer or phosphorus doped glass layer in this application. As will be appreciated, other portions of the substrate not illustrated include, for example, gate members which may be fabricated from polysilicon or metal.

A photoresist layer 18 is formed over layer 16; in the presently preferred embodiment, the photoresist layer is approximately 1.5 microns thick. Then, using ordinary photolithographic techniques, an opening 19 is formed through the photoresist layer 18 above the doped region 12. The width of this opening, which later determines the width of the opening through the oxide layer 14 may be as narrow as can be made with the particular photolithographic steps employed.

Figure 2:
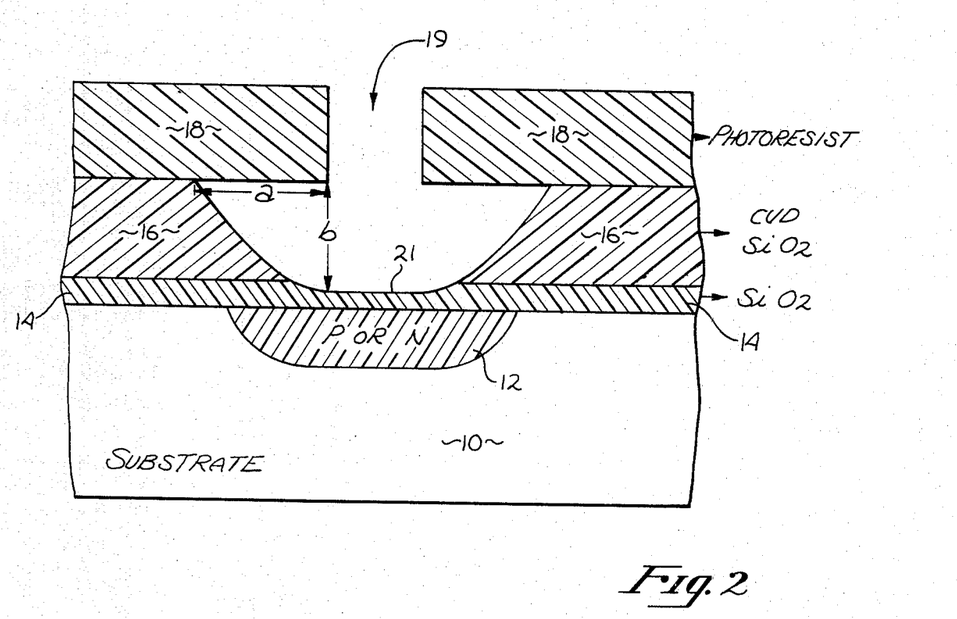
FIG. 2 illustrates the substrate of FIG. 1 after an opening has been formed through the deposited dioxide layer.

Referring now to FIG. 2, the substrate is subjected to a wet etchant to etch through the deposited oxide layer 16. In the presently preferred process, hydrofluoric acid is used for a period of 80 seconds. (The etchant consists of a 40% solution of $NH_3F$ and a 49% solution of HF in a 6 to 1 ratio.) The layer 16 etches quite quickly and significant undercutting occurs under the photoresist layer 18. Thus, a tapered opening results as shown in FIG. 2. For the above-described layer 16, and the above-described etchant, the dimension "a" of FIG. 2 is equal to 1.3b. Since the layer 16 etches approximately 8 times faster than the thermally grown silicon dioxide, very little of the layer 14 is etched during this step. A slight depression 21 is formed on layer 14 as indicated.

Figure 3:
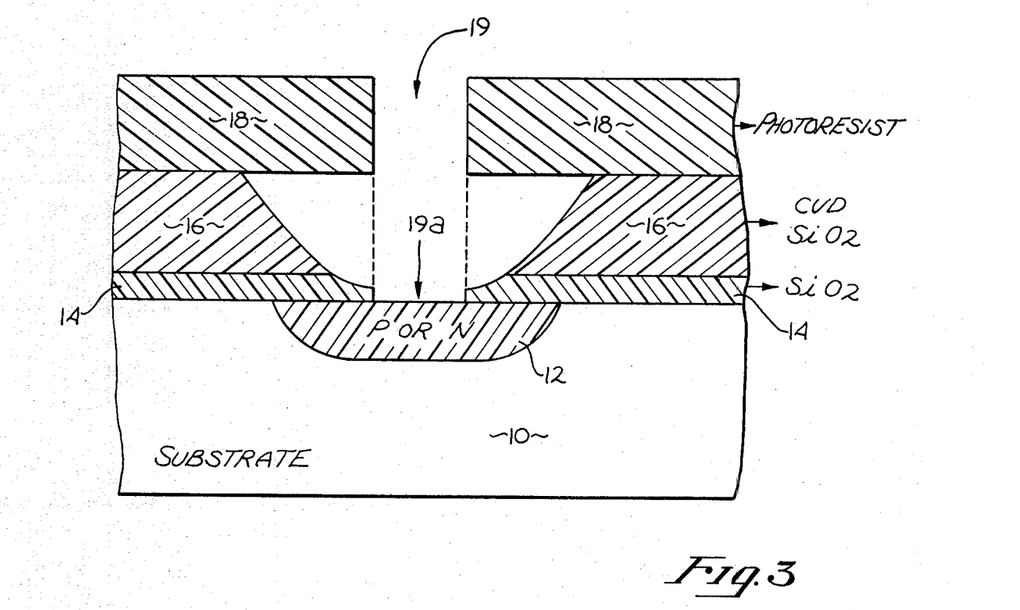
FIG. 3 illustrates the substrate of FIG. 2 after an opening has been formed through the thermally grown oxide layer.

Referring now to FIG. 3, the layer 14 is etched using an anisotropic plasma etchant. In the presently preferred embodiment $C_2F_6:CHF_3$ in equal volumes is employed. The opening 19a is formed through the layer 14 in alignment with the opening 19. The resultant opening through the oxide layers, as indicated in FIG. 3, thus consists of a tapered opening through the layer 16 and a substantially narrower opening through the oxide layer 14. The latter opening may be as narrow as the opening formed through the photoresist layer.

Figure 4:
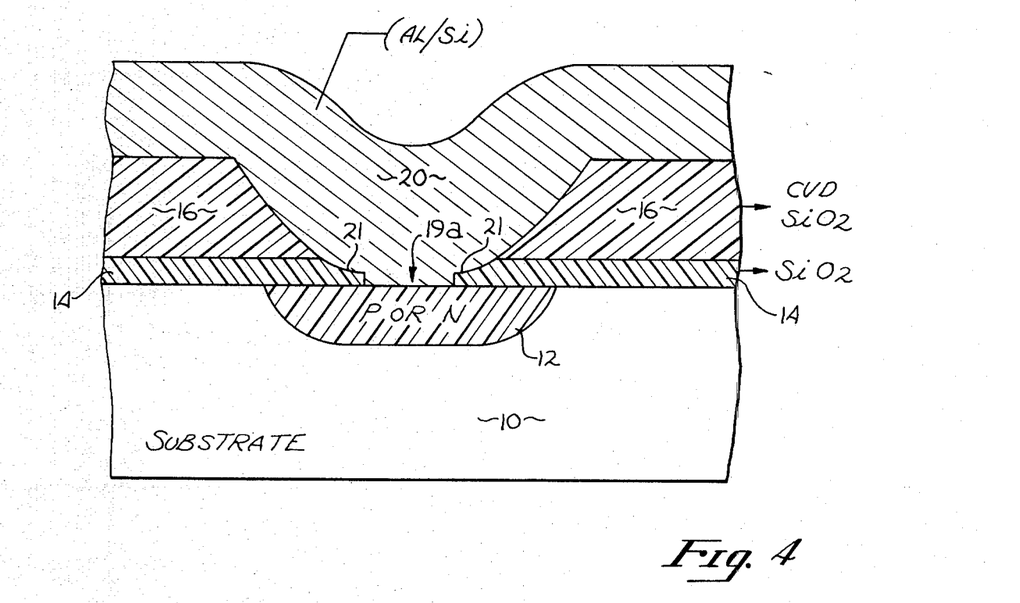
FIG. 4 illustrates the substrate of FIG. 3 after the photoresist layer has been removed and with a contact member formed within the opening.

Next, as indicated in FIG. 4, after removal of the photoresist layer, a metal layer and/or metal contact may be formed in the opening. In the presently preferred process, an aluminum-silicon alloy is employed to form a contact 20. This contact, as is apparent, contacts the region 12 at the opening 19a. Because of the tapered opening through layer 16, there are no sharp corners and thus no problems with metal layer step coverage in the contact 20. The narrow opening 19a is important because, for example, it allows the doped region 12 to be smaller, allowing higher density circuits to be fabricated.

In some cases, it is undesirable to employ a deposited silicon dioxide layer with a high percent of phosphorus, (e.g., 8–10%). One reason for this is that when plastic packages are employed, the glass layer is more apt to be exposed to moisture. The moisture on the phosphorus doped glass produces $H_3PO_4$ which dissolves aluminum. Thus, in some cases, a low phosphorus glass (2–4%) is employed.

Figure 5:
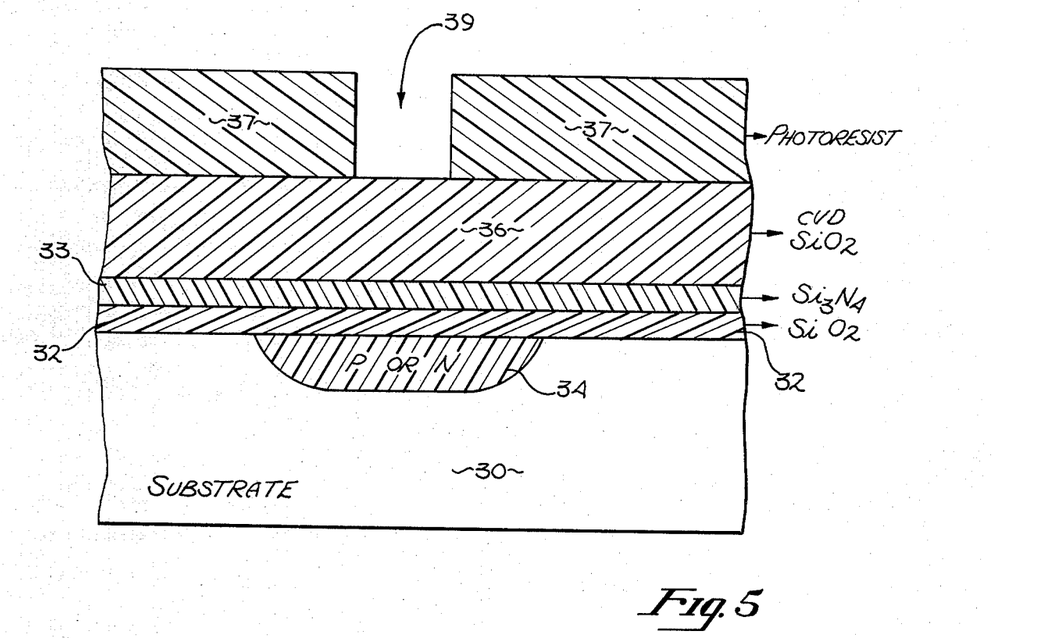
FIG. 5 is a cross-sectional elevation view of a substrate which includes a doped region, thermally grown oxide layer, silicon nitride layer, deposited silicon oxide layer and a photoresist layer with an opening formed through it.

Referring now to FIG. 5, a substrate 30 is illustrated which includes a doped region 34. A thermally grown oxide layer 32 is formed on the substrate 30. The thickness of this layer as presently preferred is approximately 1000 A. Unlike the previous embodiment discussed in conjunction with FIGS. 1–4, where the deposited oxide layer is formed directly in the thermally grown oxide layer, an intermediate silicon nitride ($Si_3N_4$) layer 33 is employed. Thus, a silicon nitride layer 33 is formed over the layer 32. As presently preferred this layer is approximately 1000 A thick. Then the low phosphorus deposited layer 36 is formed over layer 33. Again, this layer is approximately 1 micron thick. Now, a photoresist layer 37 is formed over layer 36 and an opening 39 formed through layer 37 above the region 34.

Figure 6:
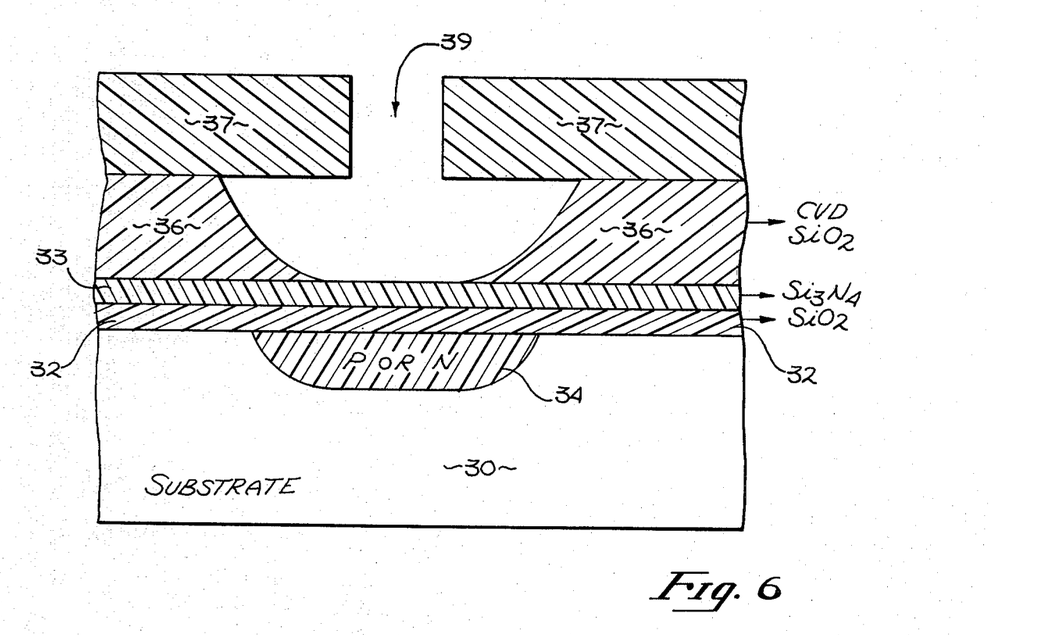
FIG. 6 illustrates the substrate of FIG. 5 after an opening has been formed through the deposited oxide layer.

A wet etchant is used to etch through the layer 36 (FIG. 6). For example, the hydrofluoric acid solution above-mentioned is used for approximately 3 minutes. Unlike the previous embodiment, the layer 36 etches more slowly since it contains less phosphorus. The silicon nitride layer 33 forms an etchant stop and prevents the etchant from attacking the thermally grown oxide 32. Note without the layer 33, significant etching would occur in layer 32.

Figure 7:
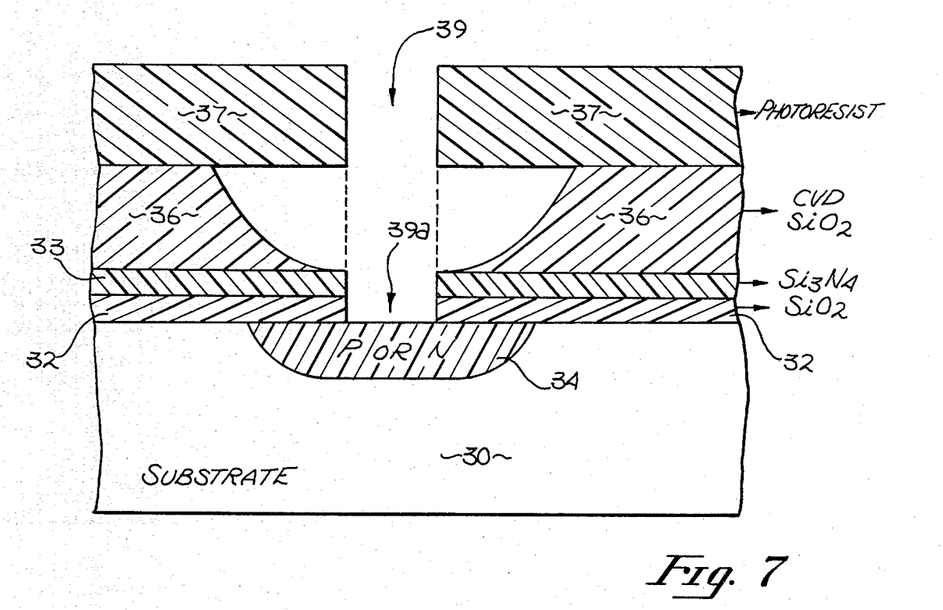
FIG. 7 illustrates the substrate of FIG. 6 after an opening has been formed through the silicon nitride layer and thermally grown oxide layer.

Now referring to FIG. 7, an anisotropic plasma etchant is used to etch through the layers 33 and 32. An opening 39a is formed in alignment with the opening 39. In the presently preferred process, the plasma etching comprises $C_2F_6:CHF_3$ in equal volumes and the same gases are used to etch through both the silicon nitride layer and oxide layer.

Now the photoresist layer 37 may be removed and a contact formed within the opening, in contact with the region 34. Again, an aluminum-silicon alloy is used in the presently preferred embodiment.

Figure 8:
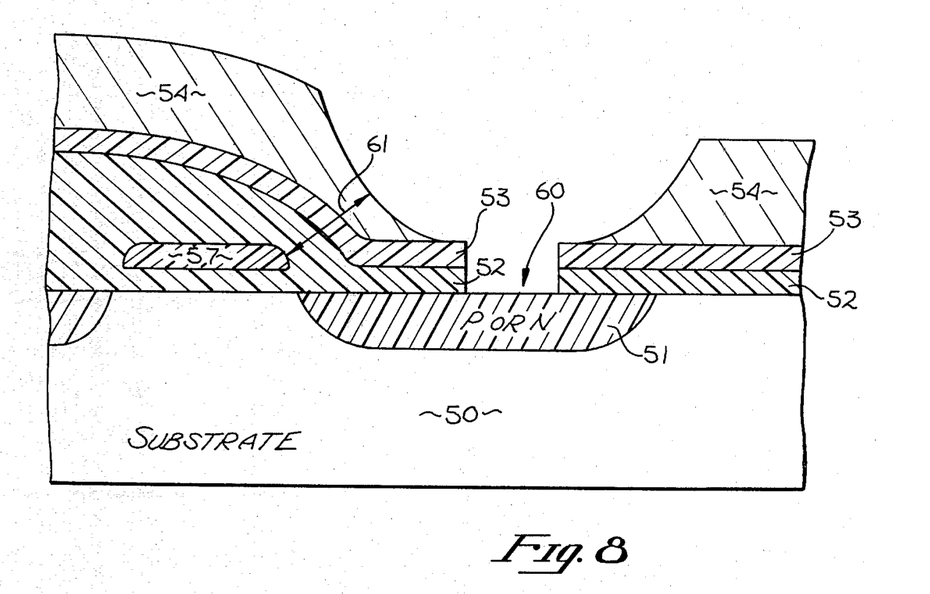
FIG. 8 is a cross-sectional elevation view of a substrate and overlying layers with an opening formed through the overlying layers in accordance with the teachings of one embodiment of the present invention. This view is used to illustrate one of the advantages to one embodiment of the present invention.

An additional advantage is gained from the process described in conjunction with FIGS. 5 through 7 which is best illustrated in FIG. 8. In FIG. 8, a substrate 50 is illustrated with a doped region 51. This substrate is covered with a thermally grown oxide 52 and an overlaying layer 53 of silicon nitride, and an upper layer of a low phosphorus glass 54. An opening is formed through the layers 52, 53 and 54 as described in conjunction with FIGS. 5–7. Also illustrated in FIG. 8 is a polysilicon gate member 57, insulated from the substrate 50 and formed adjacent to the region 51.

In the formation of openings such as opening 60 of FIG. 8, there is concern that during the etching of the layer 54, sufficient etching will occur through the layer 52 to expose the gate member 57. When this occurs, a short exists between the contact formed in the opening and the gate member. To avoid this, greater spacing is generally planned between the opening 60 and gate member 57. However, with the silicon nitride layer 53, an etchant barrier is formed over the gate member 57. Therefore, when etching through layer 54, the etchant is unable to reach the gate member 57 since it is blocked by the silicon nitride. This allows tighter design tolerances between the opening 60 and gate member 57.

Thus, a process has been described for forming openings through thermal oxide layers and chemically deposited silicon dioxide layers. A larger tapered opening is formed through the deposited layer and a narrower opening through the thermal oxide layer. This allows for good metal layer step coverage in the contacts and higher density circuits without high temperature steps.

I claim:

1. In the fabrication of an integrated circuit, where a substrate is covered with a thermally grown oxide layer and where a substantially thicker deposited oxide layer containing phosphorus is formed over the grown oxide layer, a process for forming an opening and tapered contact through the oxide layers to expose a region in the substrate comprising the steps of:
   forming a photoresist layer over said deposited oxide layer with an opening through said photoresist layer over said region;
   etching through said phosphorus containing deposited oxide layer with a wet etchant such that a tapered opening is formed through said deposited oxide layer extending to said grown oxide layer;
   removing said photoresist layer; and,
   forming an ohmic contact in said tapered opening through said oxide layers;
   whereby a tapered contact is formed through said oxide layers.

2. The process defined by claim 1 wherein said wet etchant comprises hydrofluoric acid and ammonium fluoride solution.

3. The process defined by claim 2 wherein said plasma etchant is an anisotrophic plasma etchant comprising $C_2F_6$ and $CHF_3$.

4. In the fabrication of metal-oxide-semiconductor integrated circuits, where a substrate is covered with a thermally grown oxide layer and where a deposited oxide layer substantially thicker than said grown oxide layer which contains approximately 8% or more phosphorus is formed over the said grown oxide layer, a process for forming an opening and contact member through the oxide layers to contact a doped region in said substrate, comprising the steps of:
   forming a photoresist layer over said deposited oxide layer with an opening through said photoresist layer over said doped region;
   etching through said phosphorus containing deposited oxide layer with a wet etchant such that a tapered opening is formed through said deposited oxide layer extending to said grown oxide layer;
   etching through said grown oxide layer with an anisotropic plasma etchant in alignment with said opening through said photoresist layer, until said substrate is exposed at said doped region;
   removing said photoresist layer, and,
   forming a contact member in said tapered opening through said oxide layers in contact with said doped region,
   whereby a tapered contact member is formed through said oxide layers.

5. The process defined by claim 4 wherein said wet etchant comprises hydrofluoric acid and ammonium fluoride solution.

6. The process defined by claim 5 wherein said plasma etchant comprises $C_2F_6$ and $CHF_3$.

7. In the fabrication of metal-oxide-semiconductor integrated circuits, where a substrate is covered with a thermally grown oxide layer and where a substantially thicker deposited oxide layer containing phosphorus is formed above said grown oxide layer, a process for making contact to a doped region in said substrate comprising the steps of:
   forming a photoresist layer over said deposited oxide layer with an opening over said doped region;
   etching through said phosphorus containing deposited oxide layer with a wet etchant such that a tapered opening is formed through said deposited oxide layer extending to said grown oxide layer;
   etching through said grown oxide layer with a plasma etchant in alignment with said opening through said photoresist layer, until said substrate is exposed at said doped region;
   removing said photoresist layer; and,
   forming a metal alloy contact member in said opening through said oxide layers in contact with said doped region in said substrate;
   whereby a tapered contact member is formed without high temperature steps.

8. The process defined by claim 7 wherein said contact member comprises an aluminum silicon alloy.

9. In the fabrication of metal-oxide-semiconductor integrated circuits, where a substrate is covered with a thermally grown oxide layer and where a substantially thicker deposited oxide layer low in phosphorus is formed over said grown oxide layer, a process for forming a contact through said oxide layers to contact a region in said substrate comprising the steps of:
   forming a silicon nitride layer over said thermally grown oxide layer prior to the formation of said deposited oxide layer;
   forming a photoresist layer over said deposited oxide layer with an opening through said photoresist layer above said region;
   etching through said deposited oxide layer using a wet etchant, said etching continuing until said silicon nitride layer is reached which layer acts as an etchant stop for said wet etchant;
   etching through said silicon nitride layer and thermal oxide layer with an anisotropic plasma etchant thereby exposing said substrate; and,
   forming a contact member through said oxide layers and said silicon nitride layer;
   whereby a contact member is formed which is tapered.

10. The process defined by claim 9 wherein said deposited oxide layer contains approximately 4% or less of phosphorus.

* * * * *

UNITED STATES PATENT AND TRADEMARK OFFICE
CERTIFICATE OF CORRECTION

PATENT NO. : 4,372,034
DATED : February 8, 1983
INVENTOR(S) : Mark T. Bohr

It is certified that error appears in the above-identified patent and that said Letters Patent are hereby corrected as shown below:

In Claim 1, beginning at line 16 before the step
   "removing said photoresist layer", insert the
   step
   --etching through said grown oxide layer with a plasma
etchant in alignment with said opening through said photoresist
layer, until said substrate is exposed at said region;--

Signed and Sealed this

Twenty-fourth Day of November, 1987

Attest:

DONALD J. QUIGG

*Attesting Officer*    *Commissioner of Patents and Trademarks*

REEXAMINATION CERTIFICATE (3575th)
United States Patent [19]
Bohr

[11] B1 4,372,034
[45] Certificate Issued  Jul. 21, 1998

[54] PROCESS FOR FORMING CONTACT OPENINGS THROUGH OXIDE LAYERS

[75] Inventor: Mark T. Bohr, Aloha, Oreg.

[73] Assignee: Intel Corporation, Santa Clara, Calif.

Reexamination Request:
No. 90/003,703, Jan. 27, 1995

Reexamination Certificate for:
Patent No.:  4,372,034
Issued:      Feb. 8, 1983
Appl. No.:   248,013
Filed:       Mar. 26, 1981

Certificate of Correction issued Nov. 24, 1987.

[51] Int. Cl.$^6$ .......................... H01L 21/265; H01L 21/31
[52] U.S. Cl. .......................... 438/624; 438/640; 438/668; 438/704; 438/738; 438/743; 438/762; 438/763
[58] Field of Search .................. 437/947; 29/578, 29/579, 577 C; 357/40, 45; 156/628, 643, 653, 659.1; 430/314, 316, 317

[56] References Cited

U.S. PATENT DOCUMENTS

| | | |
|---|---|---|
| 3,349,408 | 10/1967 | Tarng et al. |
| 3,497,407 | 2/1970  | Esch et al. |
| 3,607,480 | 9/1971  | Harrap et al. |
| 3,635,774 | 1/1972  | Ohta. |
| 3,639,186 | 2/1972  | Forster et al. |
| 3,650,960 | 3/1972  | Stranas et al. |
| 3,658,610 | 4/1972  | Arita et al. |
| 3,670,403 | 6/1972  | Lawrence et al. |
| 3,676,240 | 7/1972  | Retajezyk. |
| 3,691,627 | 9/1972  | Engeler ........................ 29/571 |
| 3,717,514 | 2/1973  | Burgess. |
| 3,767,493 | 10/1973 | Kump. |
| 3,769,109 | 10/1973 | Macrae et al. |
| 3,839,111 | 10/1974 | Ham et al. |
| 3,842,490 | 10/1974 | Seales. |
| 3,880,684 | 4/1975  | Abe. |
| 3,891,190 | 6/1975  | Vadasz. |

(List continued on next page.)

FOREIGN PATENT DOCUMENTS

| | | |
|---|---|---|
| 50-115964 | 9/1975 | Japan. |
| 53-13372  | 2/1978 | Japan. |
| 55-95339  | 7/1980 | Japan. |

OTHER PUBLICATIONS

Folsom, R.M., Glassed Diode Aluminum Ohmic Contact, *IBM Technical Discl. Bulletin*, vol. 9, 4, p. 432 (Sep. 1966).

Raetzel et al., Etching Properties of Different Silicon Films—Abstract 142, *Electrochem Soc.—Fall Mtg.*, pp. 336–338 (1974).

Kern, W., Chemical Etching of Silicon Germanium, Gallium Arsenide, and Gallium Phosphide, *RCA Rev*, vol. 39, pp. (1978).

Avigal, Isaak, Inter–metal Dielectric and Passivation–related Properties of Plasma BPSG, *Solid–State Tech.*, pp. 217–224 (Oct. 1983).

Hall et al., The Use of Silane Silicon Dioxide Films to Contour Oxide Edges, *Thin Sold Films*, 9, (1972) pp. 447–455.

Kern et al., *Improved Reliability of Electron Devices Through Optomized Coverage of Surface Topography*, RCA Corporation, pp. 214–223.

Gartner, et al., Isotropic and Anisotropic Etching in a Diode System, *IBM Tech Disclosure Bulletin*, vol. 20, No. 5, pp. 1744–1775 (Oct. 1977).

Koste, et al., Via Profiling By Plasma Etching with Varying Ion Energy, *IBM Technical Disclosure Bulletin*, vol. 22, No. 7, pp. 2737–2738 (Dec. 1979).

*Primary Examiner*—David E. Graybill

[57] ABSTRACT

A process is described for forming an opening for a contact member through a deposited oxide layer and thermally grown oxide layer. Where the deposited oxide layer is rich in phosphorus, a wet etchant is used to etch through the deposited oxide layer. This results in a tapered opening through the deposited oxide layer. Then a plasma etchant is used to form an opening through the thermally grown oxide in alignment with an opening through a photoresist layer.

U.S. PATENT DOCUMENTS

| | | |
|---|---|---|
| 3,936,331 | 2/1976 | Luce et al. . |
| 3,945,030 | 3/1976 | Seales . |
| 3,961,999 | 6/1976 | Antipov . |
| 3,988,823 | 11/1976 | Hu . |
| 4,029,522 | 6/1977 | De La Moneda ............... 148/1.5 |
| 4,040,891 | 8/1977 | Chang et al. . |
| 4,040,893 | 8/1977 | Ghezzo ............... 156/659 |
| 4,044,454 | 8/1977 | Magdo . |
| 4,076,575 | 2/1978 | Chang . |
| 4,089,103 | 5/1978 | Hendrickson et al. . |
| 4,147,564 | 4/1979 | Magee et al. . |
| 4,148,133 | 4/1979 | Kochel et al. . |
| 4,159,561 | 7/1979 | Dingwall ............... 29/571 |
| 4,169,270 | 9/1979 | Hayes . |
| 4,178,674 | 12/1979 | Liu et al. ............... 29/571 |
| 4,180,432 | 12/1979 | Clark . |
| 4,181,564 | 1/1980 | Fogarty et al. . |
| 4,192,059 | 3/1980 | Khan et al. . |
| 4,240,196 | 12/1980 | Jacobs et al. . |
| 4,246,595 | 1/1981 | Noyori et al. . |
| 4,252,579 | 2/1981 | Ho et al. ............... 148/174 |
| 4,265,699 | 5/1981 | Ladany . |
| 4,276,098 | 6/1981 | Nelson et al. ............... 148/171 |
| 4,282,647 | 8/1981 | Richman . |
| 4,282,648 | 8/1981 | Yu et al. . |
| 4,305,974 | 12/1981 | Abe et al. . |
| 4,307,180 | 12/1981 | Pogge . |
| 4,309,812 | 1/1982 | Horng et al. . |
| 4,317,274 | 3/1982 | Yasunari . |
| 4,326,332 | 4/1982 | Kenney . |
| 4,337,115 | 6/1982 | Ikeda et al. . |
| 4,342,617 | 8/1982 | Fu et al. ............... 156/643 |
| 4,351,894 | 9/1982 | Yonezawa et al. . |
| 4,352,724 | 10/1982 | Sugishima et al. . |
| 4,354,897 | 10/1982 | Nakajima ............... 156/643 |
| 4,364,075 | 12/1982 | Bohr et al. . |
| 4,367,119 | 1/1983 | Logan et al. . |
| 4,372,803 | 2/1983 | Gigante . |
| 4,397,075 | 8/1983 | Fatula, Jr. et al. . |
| 4,426,687 | 1/1984 | Masuoka ............... 365/182 |

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–10 are cancelled.

* * * * *